Figure 1:
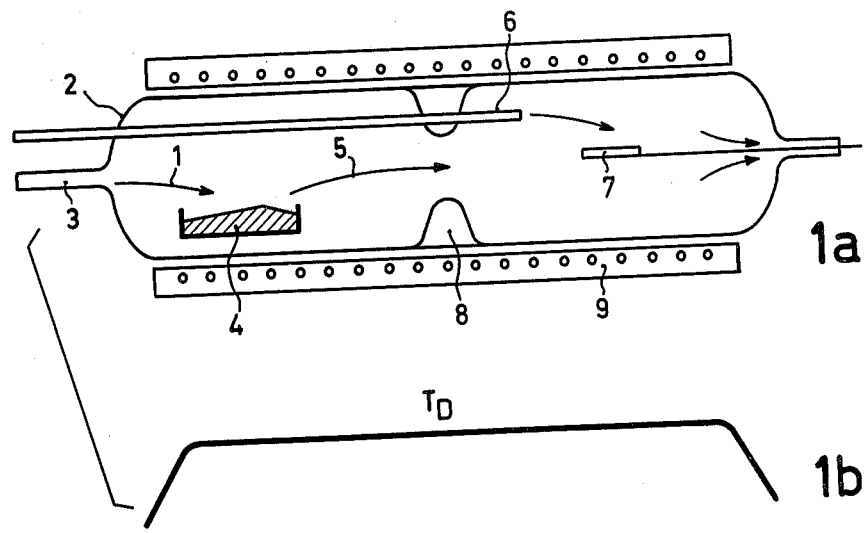

United States Patent [19]

Hallais

[11] 4,086,109
[45] Apr. 25, 1978

[54] METHOD FOR THE EPITAXIAL GROWTH OF III-V COMPOUNDS AT HOMOGENEOUS LOW TEMPERATURE UTILIZING A SINGLE FLAT TEMPERATURE ZONE

[75] Inventor: Jean-Philippe Hallais, Ablon sur Seine, France

[73] Assignee: U.S. Philips Corporation, New York, N.Y.

[21] Appl. No.: 774,524

[22] Filed: Mar. 4, 1977

[30] Foreign Application Priority Data

Mar. 10, 1976 France .................................. 76 06832

[51] Int. Cl.² .................... H01L 21/205; H01L 29/20
[52] U.S. Cl. .................................... 148/175; 156/613; 156/614; 252/62.3 GA
[58] Field of Search ................ 148/174, 175; 156/613, 156/614; 252/62.3 GA; 427/87

[56] References Cited

U.S. PATENT DOCUMENTS

| | | | |
|---|---|---|---|
| 3,145,125 | 8/1964 | Lyons | 148/175 |
| 3,762,945 | 10/1973 | DiLorenzo | 148/175 X |
| 3,975,218 | 8/1976 | Ruehrwein | 148/175 |

OTHER PUBLICATIONS

Taylor, R. C., "Epitaxial Deposition of GaAs in an Argon Atmosphere", J. Electrochem. Soc., vol. 114, No. 4, Apr. 1967, pp. 410–412.

Seki et al.; "New Vapor Growth—Single Flat Temperature Zone", Japan, J. Appl. Phys., vol. 12, No. 7 (1973), pp. 1112–1113.

*Primary Examiner*—L. Dewayne Rutledge
*Assistant Examiner*—W. G. Saba
*Attorney, Agent, or Firm*—Frank R. Trifari; Norman N. Spain

[57] ABSTRACT

The invention relates to a method for the epitaxial growth from the gaseous phase of III-V-compounds at homogeneous and low temperature by varying the atmosphere specifically, by utilizing a neutral gas in the initial transport reaction and subsequently introducing hydrogen into the gaseous mixture in the immediate vicinity of the substrate. The temperature in the epitaxial space is homogeneous and low (600° C) and the qualities of the deposited layers are considerably improved.

7 Claims, 2 Drawing Figures

METHOD FOR THE EPITAXIAL GROWTH OF III-V COMPOUNDS AT HOMOGENEOUS LOW TEMPERATURE UTILIZING A SINGLE FLAT TEMPERATURE ZONE

The invention relates to a method for the epitaxial growth of AIII-BV compounds from the vapour phase, according to which method a first gaseous phase containing a halide reacts with a liquid phase of an AIII element to obtain a second gaseous phase to which hydrogen is added, the temperature of the second gaseous phase being identical to that of the first gaseous phase. The invention also relates to semiconductor devices obtained by using said method.

An AIII element is to be understood to mean herein an element of column III of the periodic table of elements and a BV element is to be understood to mean an element of column V of the same table.

Methods for the epitaxial growth consist of growing a single crystal of a given compound on a monocrystalline substrate of the same or another compound. The great advantage of epitaxial growth is that the resistivities and the conductivity types of the epitaxial layer and of the substrate can be independent.

Such methods are known, for example, from the article published in "Japanese Journal of Applied Physics", volume 12, No. 7, pages 1112 and 1113, July 1973 entitled: "A new vapor growth method for GaP using a single flat temperature zone" by H. Seki c.s.

According to the method described in this article, advantages are obtained due to the presence of a single temperature zone and simple means to control said temperature. Furthermore, defects and dislocations caused by temperature gradients are avoided. One of the great problems of this method, however, is that it seems to result in operation at too high temperatures.

It is the object of the invention to mitigate this drawback by providing a new method of epitaxial growth in which the temperature of the gaseous phase may be both homogeneous and low.

According to the invention, the method is characterized in that the first gaseous phase comprises as a halide a halogen of the BV element and a neutral gas and is free from hydrogen.

The method according to the present invention thus maintains the advantages of a method at homogeneous temperature and moreover enables low operating temperatures, the rate of deposition at temperature lower than 600° C being nevertheless comparatively high. The deposition phenomenon according to the present invention is actually to be ascribed to a change of the reaction which also results in the deposition of the AIII-BV compound, while the deposition phenomenon according to the above-stated article is due to a deposition equilibrium reaction, the BV compound being introduced in the second gaseous phase at the level of the substrate.

According to an embodiment of the invention the method is characterized in that the neutral gas is selected from the group of helium and nitrogen.

A neutral gas is to be understood to mean herein a gas which does not take part in the reaction and which actually serves for the transport of the various gaseous compounds.

According to an embodiment of the invention the method is characterized in that the temperature of the said gaseous phases is chosen to be between 500° and 800° C and more in particular is near 600° C.

The method according to the invention thus enables the operation at low temperature and as a result of this permits of improving especially the properties of the deposited layers.

According to a modified embodiment of the invention the method is characterized in that the AIII-BV compound is gallium arsenide, which compound has proved to be very important for the manufacture of various semiconductor devices, such as FET transistors, GUNN diodes and so on.

Figure 2:
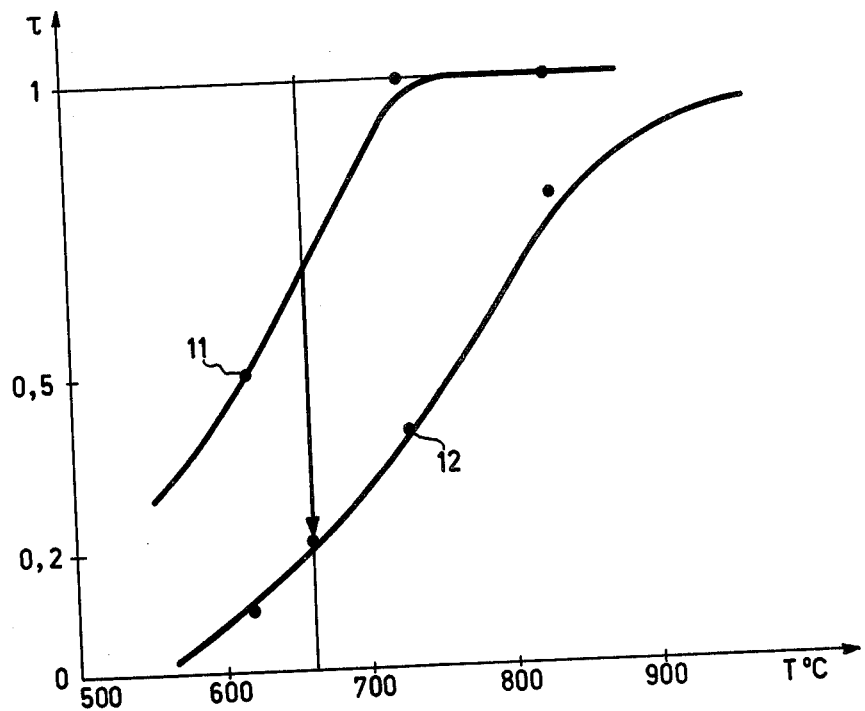

The invention will now be described in greater detail, by way of example, with reference to the accompanying drawing, in which FIG. 1 is a diagrammatic illustration of an epitaxial furnace for carrying out the method according to the invention, FIG. 2 is a diagram showing the variation of the transport rate as a function of the temperature.

The method for the epitaxial growth from the gaseous phase of AIII-BV compounds is carried out in a reactor as is shown in FIG. 1. A first gaseous phase 1 which comprises a halide is conveyed to the inlet of a space 2 through a pipe 3 and reacts with a liquid phase 4 of an AIII element so as to give a second gaseous phase 5. Via a tube 6 extending through the epitaxial space 2 up to the level of the substrate 7, a hydrogen gas is conveyed; constrictions 8 which are present centrally in the epitaxial space considerably avoid the mixing with gas currents upstream. The space 2 is surrounded by one single heating device 9.

The temperature diagram along the epitaxial space is shown in the diagram 1b. The temperature along the furnace is homogeneous.

According to the invention the first gaseous phase 1 comprises, as a halide, a halide of the BV element and a neutral gas; this first gaseous phase is free from hydrogen.

The second gaseous phase thus comprises in equilibrium compounds of the AIII and BV elements. Arsenic and gallium are hereinafter mentioned as AIII-BV elements, although they do not constitute any restriction of the invention. As a neutral gas is chosen a gas from the group consisting of helium and nitrogen; the principal neutral gas used was helium.

The reaction which is carried out at the level of the liquid gallium phase is then written:

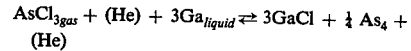

Said second gaseous phase is free from hydrogen; hydrogen is introduced at the level of the substrate 7, a new equilibrium occurs as a result of the following chemical equation:

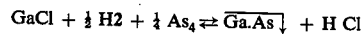

In order to describe said equilibrium variation quantitatively, FIG. 2 shows the variation of the transport rate $\tau$, namely the quantity of the element Ga which is transported with respect to the quantity of chlorine which is introduced in the system as a function of the temperature.

Reference curve 11 denotes the variations of the transport rate as a function of the temperature during the use as a carrier gas of a neutral gas, such as helium. Reference curve 12 denotes the variation of the transport rate as a function of the temperature during the use as a carrier gas of a reactive gas such as hydrogen.

At the usual reaction temperatures, namely between 500° and 900° C, reference curve 12 is constantly below reference curve 11. In the method according to the invention the movement of the reaction at constant temperature, by change of the gaseous phase, at the level of the substrate, is denoted diagrammatically by a vertical movement of reference curve 11 towards reference curve 12. Such a movement is visible at any temperature, at least so long as curve 12 is situated below curve 11 and more in particular at low temperatures, for example in the order of 600° C, which enables a simplification of the epitaxial furnaces used.

Such a vertical displacement thus corresponds to a decrease of the transport rate, hence to a deposition of gallium arsenide.

From the above description it appears that the epitaxial phase is technologically very simple because it comprises only a single temperature zone and the deposited layers have better electrical properties because they have been deposited at comparatively low temperatures (600° C). The resulting semiconductor devices such as the FET transistors, GUNN diodes have confirmed the quality of the layers deposited according to the method of the invention.

It will be obvious that the above description does not constitute in any way a restriction of the present invention because the method also extends to other AIII-BV compounds and possible dopants may be introduced into the gas flows without thereby departing from the scope of the present invention.

What is claimed is:

1. A method for the epitaxial deposition of an AIII-BV compound on a monocrystalline substrate from the vapor phase comprising: in a single flat temperature zone, forming as a first gaseous phase a hydrogen free mixture of a halide of a BV element and a neutral gas, reacting said first gaseous phase with an AIII element in the liquid phase so as to form a second gaseous phase, said first and second gaseous phases being formed remote from said substrate, and then mixing said second gaseous phase with hydrogen in the immediate vicinity of said substrate to thereby deposit and epitaxial layer of said AIII-BV compound on said substrate.

2. A method as claimed in claim 1, characterized in that the neutral gas is selected from the group consisting of helium and nitrogen.

3. A method as claimed in claim 1, characterized in that the temperature of the said gaseous phase is chosen between 500° and 800° C.

4. A method as claimed in claim 3, characterized in that the temperature is about 600° C.

5. A method as claimed in claim 1, characterized in that the AIII-BV compound is gallium arsenide.

6. The method of claim 1 including the step of introducing a dopant of one conductivity type into at least one of said gaseous phases.

7. The method of claim 1 wherein a multiplicity of layers of an AIII-BV compound are deposited on said substrate.

* * * * *

UNITED STATES PATENT AND TRADEMARK OFFICE
CERTIFICATE OF CORRECTION

PATENT NO. : 4,086,109
DATED : April 25, 1978
INVENTOR(S) : JEAN-PHILIPPE HALLAIS It is certified that error appears in the above-identified patent and that said Letters Patent are hereby corrected as shown below:

Column 4, line 14, "and" should be -- an --.

Signed and Sealed this

Nineteenth Day of September 1978

[SEAL]

Attest:

RUTH C. MASON
*Attesting Officer*

DONALD W. BANNER
*Commissioner of Patents and Trademarks*